United States Patent [19]

Kobold et al.

[11] Patent Number: 5,040,996

[45] Date of Patent: Aug. 20, 1991

[54] CENTRAL CIRCUIT ARRANGEMENT FOR MOTOR VEHICLES

[75] Inventors: Ulrich Kobold, Stromberg; Heinz J. Kuhn, Waldalgesheim; Karl F. Butzbach, Bad Kreuznach; Manfred Hill, Bingen, all of Fed. Rep. of Germany

[73] Assignee: Franz Kirsten Elektrotechnische Spezialfabrik, Bingen-Bingerbrück, Fed. Rep. of Germany

[21] Appl. No.: 536,629

[22] PCT Filed: Dec. 30, 1988

[86] PCT No.: PCT/DE88/00783

§ 371 Date: Jul. 2, 1990

§ 102(e) Date: Jul. 2, 1990

[87] PCT Pub. No.: WO89/06201

PCT Pub. Date: Jul. 13, 1989

[30] Foreign Application Priority Data

Dec. 31, 1987 [DE] Fed. Rep. of Germany ....... 3744603
Dec. 27, 1988 [DE] Fed. Rep. of Germany ....... 3843972

[51] Int. Cl.⁵ .............................................. H01R 9/09
[52] U.S. Cl. ........................................ 439/76; 439/45; 439/511
[58] Field of Search ...................... 439/45, 49, 75, 76, 439/78, 510–512

[56] References Cited

U.S. PATENT DOCUMENTS

| | | | |
|---|---|---|---|
| 4,685,753 | 8/1987 | Isshiki et al. | 439/76 |
| 4,689,718 | 8/1987 | Maue et al. | 439/511 |
| 4,715,822 | 7/1986 | Stribel | 439/74 |
| 4,764,849 | 8/1988 | Khan | 439/49 |
| 4,778,393 | 10/1988 | Hosogai et al. | 439/45 |
| 4,781,600 | 11/1988 | Sugiyama et al. | 439/45 |
| 4,811,168 | 3/1989 | Chesnut et al. | 439/76 |
| 4,850,884 | 7/1989 | Sawai et al. | 439/76 |
| 4,859,806 | 8/1989 | Smith | 439/511 |
| 4,959,018 | 9/1990 | Yamamoto et al. | 439/76 |
| 4,963,099 | 10/1990 | Sato et al. | 439/76 |

FOREIGN PATENT DOCUMENTS

| | | |
|---|---|---|
| 0240453 | 10/1987 | European Pat. Off. . |
| 2836166 | 11/1979 | Fed. Rep. of Germany . |
| 3048451 | 5/1985 | Fed. Rep. of Germany . |
| 3439410 | 4/1986 | Fed. Rep. of Germany . |
| 3608752 | 5/1987 | Fed. Rep. of Germany . |

Primary Examiner—Paula A. Bradley
Attorney, Agent, or Firm—Spencer & Frank

[57] ABSTRACT

A central circuit arrangement for motor vehicles for central connection of electrical components such as fuses, switchgear, cable harnesses, electronic control units for electrical consumers and similar, comprises a layered conductor packet consisting of flat printed circuit boards superimposed in various planes and mutually separated by insulating boards. In order to establish a large number of different printed circuit board circuits separately and selectively in accordance with the relevant requirements, an electric distributing board (10) is inserted between two neighboring insulating boards (9, 11). Pin strips (21) for making contact with the printed circuit boards (8, 12) adjacent to the insulating boards (9, 11) are mounted on the distributing board (10). A strip conductor (25) with a free connection (26) is associated with each pin (22) of each pin strip (21). A plurality of other separate strip conductors (27) with at least two connections (28) are provided on the distributing board (10). The connections (26, 28) of the strip conductors (25, 27) can be selectively connected with straps (29) of appropriate height and possibly different design.

16 Claims, 10 Drawing Sheets

CENTRAL CIRCUIT ARRANGEMENT FOR MOTOR VEHICLES

BACKGROUND OF THE INVENTION

The invention relates to a central circuit arrangement for motor vehicles for the central connection of electrical components, such as fuses, switching devices, electronic controls for electrical loads and the like, and including a plate-like layered packet of conductors which is composed of flat printed circuit boards that are stacked on top of one another in different planes and are separated from one another by insulating plates.

Such a central circuit arrangement essentially performs a distributing function in order to supply the electrical loads of the motor vehicle, such as, for example, lights, windshield wipers, blinkers and the like, with electrical voltage by way of conductor strands and wiring harnesses, so as to monitor the operational readiness of the loads, detect and indicate possible faults and, if necessary, interrupt faulty current paths. The actuation of the electrical loads is here effected by way of switching devices which are plugged in on the upper face of the central circuit arrangement as are the fuses for the load circuits. The socket pins engage in pin sockets attached to the uppermost flat circuit board of the central circuit arrangement. The wiring harnesses are here contacted on the underside of the central circuit arrangement by way of plug-in connectors. The plugged-in switching devices usually include an electronic control circuit with which the respectively associated electrical load is controlled.

The actual switching process for switching the load in and out is effected by means of a relay provided in the switching device. On the basis of the structural and manufacturing technology design of the flat printed circuit boards and the plug-in sockets, the central circuit arrangement is rigidly fixed with respect to its distributor function and can be set or adapted for different requirements only at above-average expense. Different configurations of flat printed circuit board circuitry can be realized only by means of particularly cost-intensive retooling which is not economically justified, particularly where small series are involved.

To overcome this drawback, DE-OS 3,525,085 already discloses a central circuit arrangement which includes a packet of conductors that are arranged on flat printed circuit boards which are stacked on top of one another in different planes and separated from one another by insulating plates. They are provided with plug-in sockets to receive plug-in portions disposed at components, with at least one conductor being disposed at at least one of the plug-in sockets so as to project beyond the conductor packet at at least one side thereof and to be selectively connected to at least one of the conductors of the insulated, stacked, flat printed circuit boards by way of a conductive bridge disposed on the side of the conductor packet. Since the conductors project laterally from the conductor packet, on the one hand, the number of possible circuit connections is greatly limited because of the amount of space available and, on the other hand, it is not possible to establish a direct electrical connection between opposing conductors that project from the conductor packet. Moreover, the known central circuit arrangement requires a conductor packet that is composed of a relatively large number of flat printed circuit boards and insulating plates because many free, unoccupied flat printed circuit board current paths are required to permit electrical connections to be made between one long side of the conductor packet and the other long side of the conductor packet.

SUMMARY OF THE INVENTION

It is the object of the invention to provide a central circuit arrangement of the above-mentioned type with which, corresponding to respective requirements, a large number of different flat circuit board circuits can selectively be individually fixed by simple means, requiring, however, the least possible number of individual layers, i.e. flat printed circuit boards and insulating plates.

This is accomplished by the invention in that an electrical distributor plate with attached pin strips for contacting the flat circuit boards adjacent to the insulating plates is disposed between two adjacent insulating plates, with each pin of each pin strip having an associated conductor path and a free terminal; and a plurality of further, separate conductor paths having at least two terminals are provided on the distributor plate; with the terminals of the conductor paths being selectively connectable by way of straps which, if required, have different height configurations.

The selective connection of the many terminals on the distributor plate by way of the straps eliminates the need for expensive retooling for different flat printed circuit board configurations in order to adapt them individually to the various requirements for the realization of a multitude of differently configured load circuits. This enables the most varied circuits for the different requirements to be created in the factory simply by changing the placement of the straps. Additionally, the central circuit arrangement according to the invention ensures a compact combination of all current paths in a conductor packet composed of only a few plates. To further increase the number of selectively establishable circuits, an advantageous feature of the invention provides that the terminals of the conductor paths on the distributor plate are selectively connectable by way of straps projecting laterally from the conductor packet with the terminals of the insulated, stacked, flat printed circuit boards.

In order to reliably prevent a short circuit between adjacent straps, an advantageous modification of the subject matter of the invention provides that the straps are coated with an insulating lacquer.

According to a further feature of the solution according to the invention, each strap includes two plug-in components which are angled away from a base member and are provided with a pinched portion, with the distance of the pinched portion from the free end of each plug-in component being slightly larger than the thickness of the distributor plate and the flat printed circuit boards, respectively. In this way, installation of the straps is considerably simplified since the plug-in components of the straps can be inserted into the terminals only until they reach the pinched portions. Advisably, according to requirements, the basic member of the straps is bent so that it is disposed in different planes.

The conductor paths of the distributor plate may be a drawback if their copper coating comes loose during the connection with the straps, particularly during laser welding, so that a reliable contact is no longer ensured. Moreover, the relatively slight thickness of the copper coating on the conductor paths not always presents a sufficient cross section for current flow. Therefore, in an advantageous alternative embodiment of the subject matter of the invention, the pin strips are replaced by rows of pins and the conductor paths and their free terminals are replaced by contact sockets which are inserted into corresponding perforations of the distributor plate. The passage bore of the contact sockets in each case receives the free ends of several associated straps or the pin of a row of pins as well as the free end of a strap or the free ends of several associated straps. This measure prevents damage to the contact socket, which could lead to a weakening of the cross section, during laser welding of the parts to be connected to one another, thus resulting in a reliable current transfer between these components. Moreover, the strength of the contact socket provides a sufficient cross section for current flow. Thus an exact current transfer is realized.

To realize a reliable fixation of the contact sockets in the distributor plate, every contact socket is preferably composed of a sleeve provided with a continuous flange at its end and inserted in a press fit into the perforation in the distributor plate, with the flange resting on the upper face of the distributor plate.

In an advantageous modification of the subject matter of the invention, the sleeve of the contact socket is provided with constrictions between which are arranged the free ends of the straps and possibly the pin of a row of pins. In a simple manner, this results in predetermined positioning of the components to be received by the sleeve.

In order to realize a compact structure, a further advantageous feature of the invention configures the sleeve of the contact socket and its constrictions in such a manner that the free ends of the straps inserted therein and possibly the pin of a row of pins laterally contact one another.

In an alternative embodiment of the invention, each contact socket is configured as tubular rivet which accommodates the ends of the straps and possibly the pin of a row of pins inserted therein so that they laterally contact one another. In this way, it is possible to employ a commercially available component.

In order to ensure a firm seat of the tubular rivet in the distributor plate, the head of the tubular rivet is advisably supported on the upper side of the distributor plate and the base of the tubular rivet is caulked to the underside of the distributor plate by way of three projections that are spaced at 180° relative to one another.

Additionally it is preferably provided that components such as resistors, capacitors, transistors, microprocessors, of the electronic controls for the various electrical loads of the motor vehicle are arranged on the distributor plate separated from the flat plug-in fuses and switching devices disposed on a carrier plate associated with the upper flat printed circuit board of the conductor packet and are connected with the terminals on the distributor plate by way of conductor paths. In this way, the electronic controls for the electrical loads can be produced easily and cost-effectively on the distributor plate so that the switching devices to be plugged into the carrier plate can also be manufactured more easily and economically since in most cases uniform mass produced series equipped, for example, only with one relay, can be realized.

To permit a compact and economical combination of several different electronic controls for actuating the various electrical loads of the motor vehicle, a further advantageous embodiment of the invention provides that the electronic controls for the various electrical loads of the motor vehicle ar centrally combined in a microcomputer on the distributor plate. This microcomputer includes at least one microprocessor in the form an an electronic computer and at least one program memory as well as at least one input/output unit and associated peripherals. Additionally, the combination in a microcomputer provides the advantage that the most varied control functions can be considerably broadened in the smallest possible space.

Moreover, plain connectors for the connection of wiring harnesses and extending through the bottom of a housing accommodating the conductor packet and the carrier plate are advisably provided in an area defined by a collar shaped to the housing bottom. In this case it is preferred that the housing is closed by means of a lid which covers the flat plug-in fuses and the switching devices on the carrier plate.

A method of producing and installing the straps for a central circuit arrangement according to the invention is characterized in that, in dependence on the intended placement of the straps on the distributor plate, a computer controlled automatic apparatus initially determines the length and height of the straps, then bends the straps accordingly and thereafter mounts them on the distributor plate and laser welds or solders them. This method ensures fully automatic production of the distributor plate.

BRIEF DESCRIPTION OF THE DRAWINGS

The idea on which the invention is based will be described in greater detail below with reference to several embodiments that are illustrated in the drawing figures. It is shown in.

DESCRIPTION OF THE PREFERRED EMBODIMENTS

Figure 1:
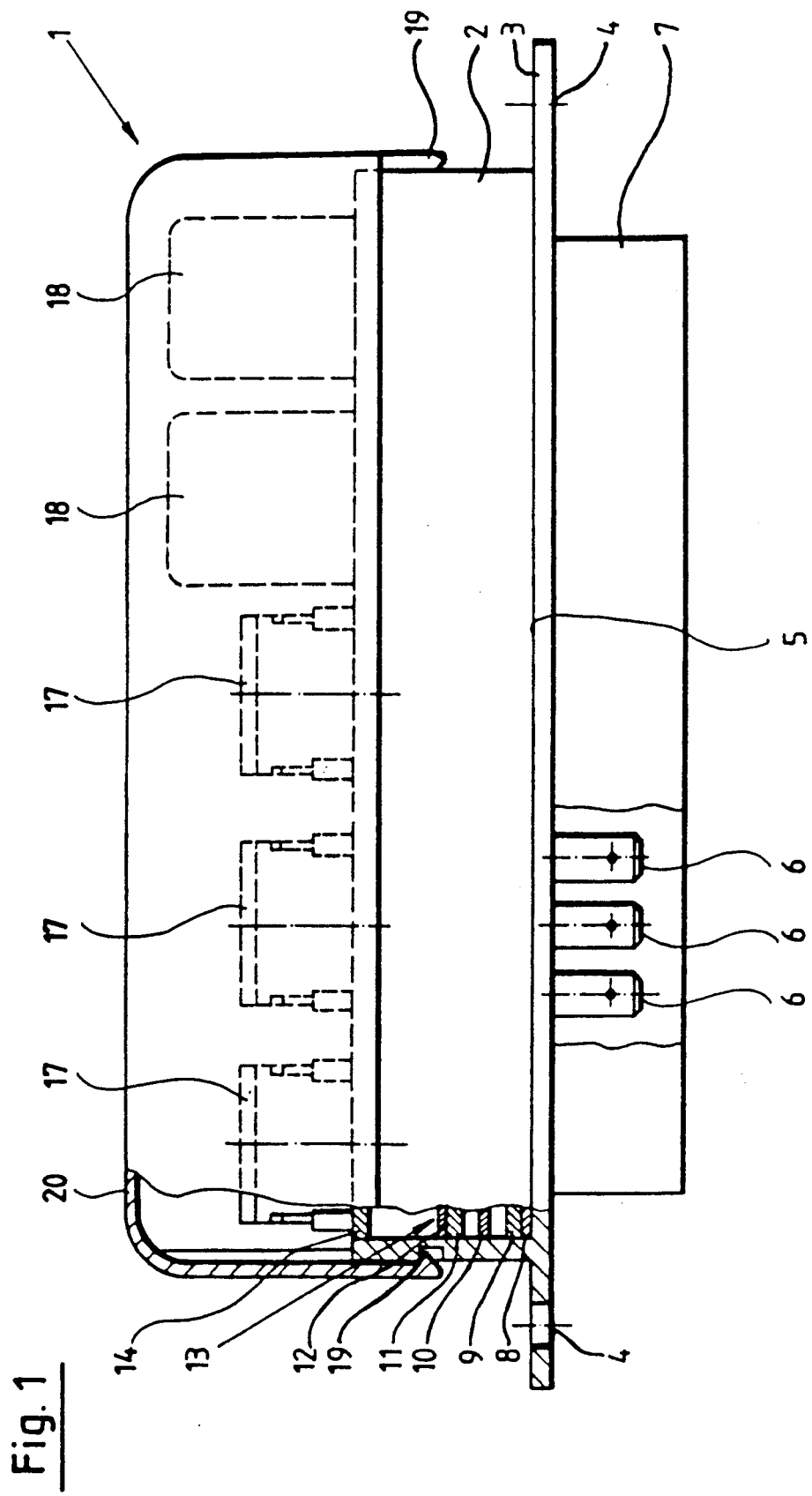
FIG. 1, a side view of the central circuit arrangement, seen partially in section.
Figure 2:
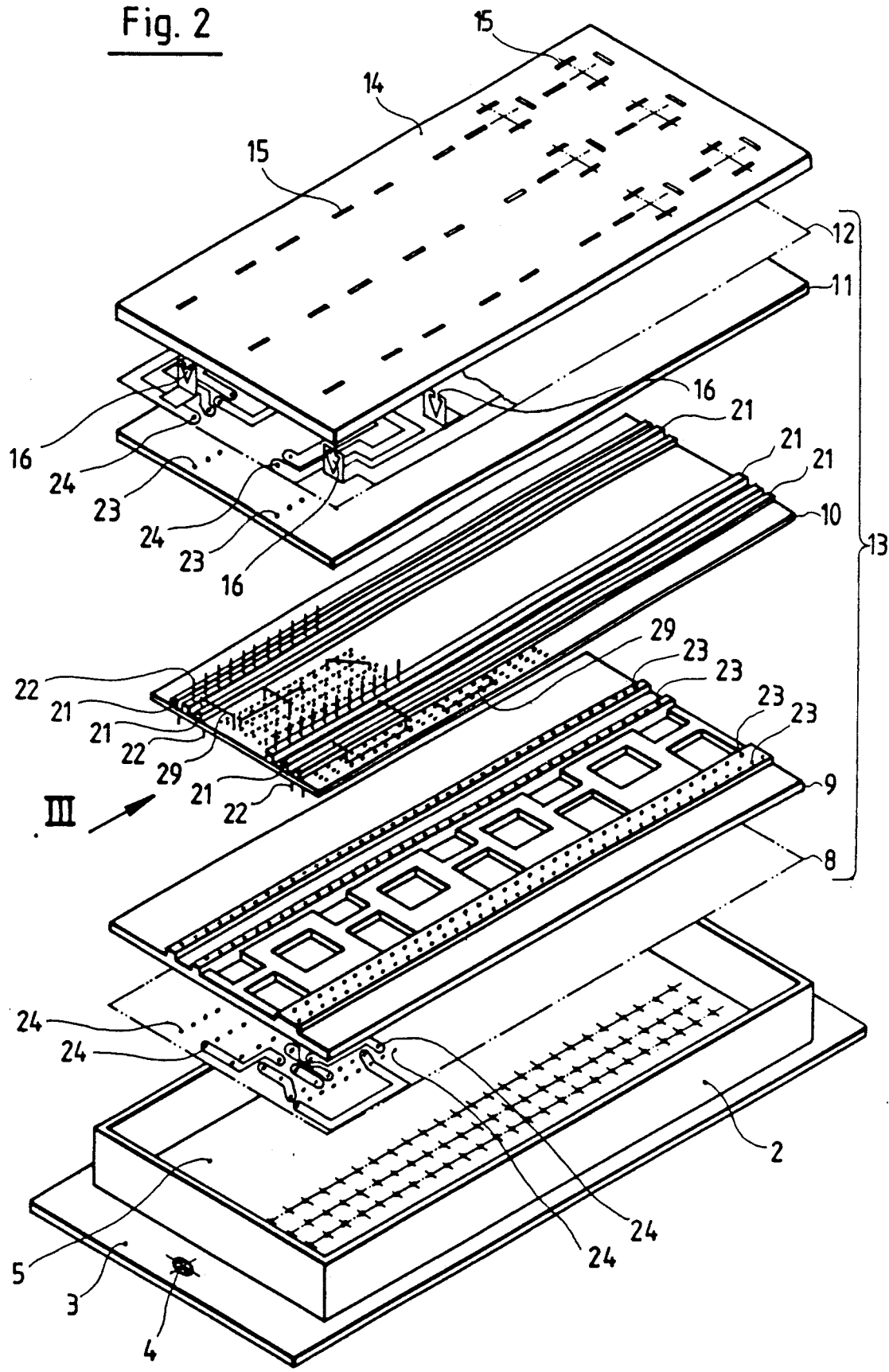
FIG. 2, a perspective illustration of the association of the individual components of the central circuit arrangement according to FIG. 1 except for the housing lid.
Figure 3:
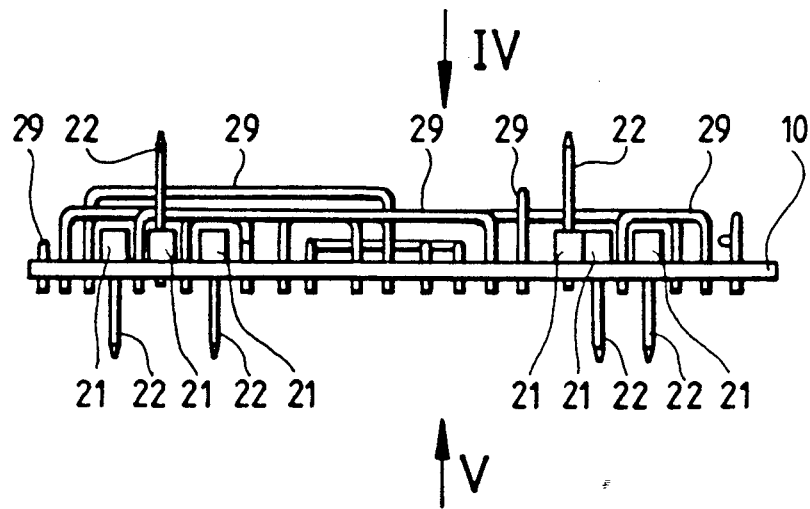
FIG. 3, a view, to an enlarged scale, of the distributor plate of the central circuit arrangement according to FIG. 1 seen in the direction of arrow III.
Figure 4:
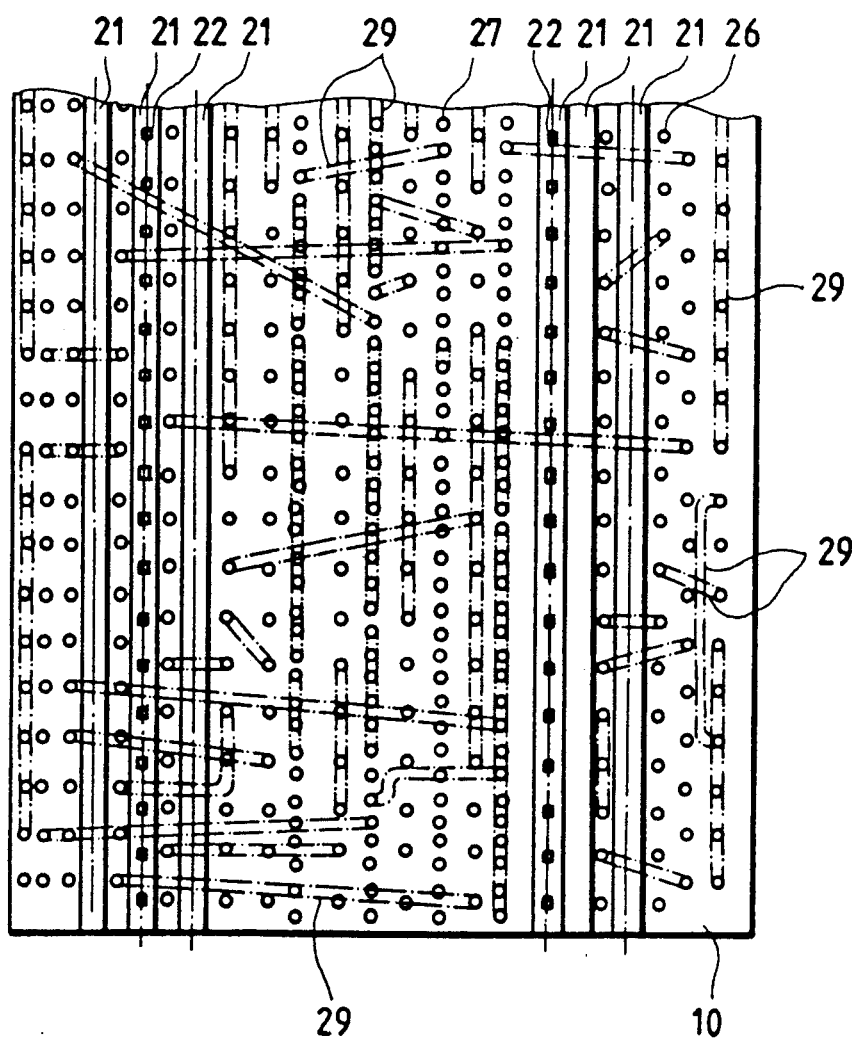
FIG. 4, a partial view of the distributor plate of FIG. 3 seen in the direction of arrow IV in which, for the sake of clarity, the straps are shown in dash-dot lines.
Figure 5:
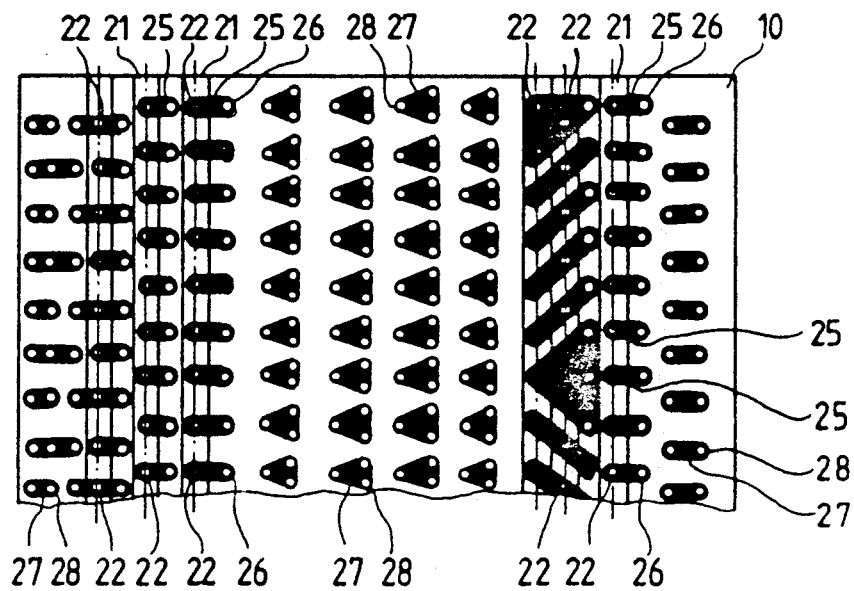
FIG. 5, a partial view of the distributor plate of FIG. 3 seen in the direction of arrow V.
Figures 6, 7:
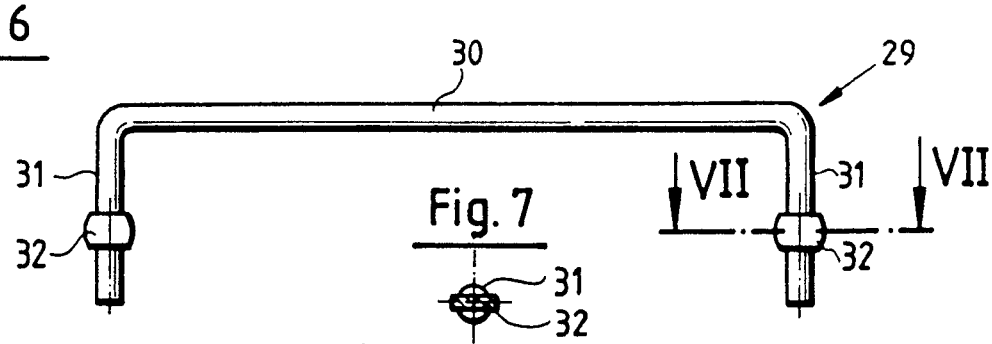
FIG. 6, a detail view, to an enlarged scale, of a strap of the distributor plate of FIG. 3.
FIG. 7, a sectional view seen along line VII—VII of the strap of FIG. 6.
Figure 8:
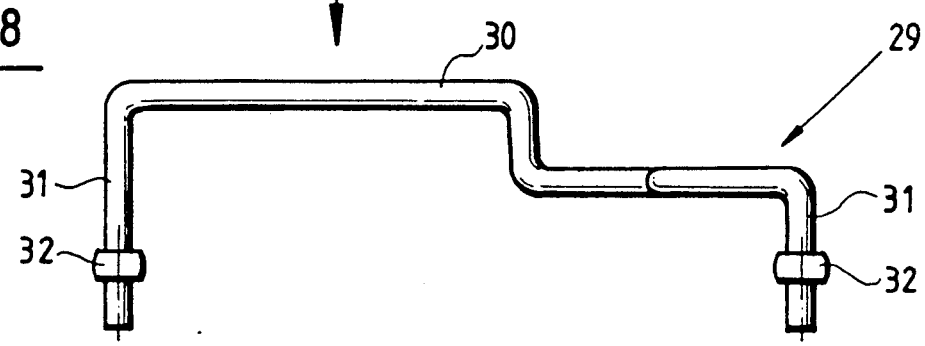
FIG. 8, an alternative embodiment of the strap according to FIG. 6.
Figure 9:
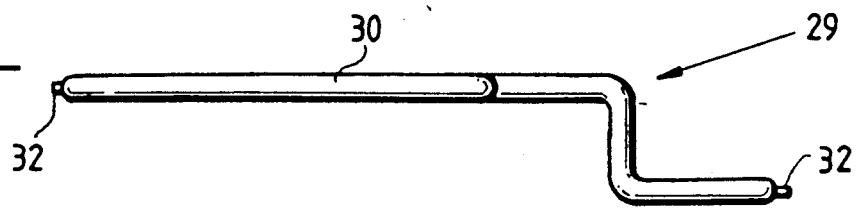
FIG. 9, a view of the strap of FIG. 8 in the direction of arrow IX.

The central circuit arrangement 1 intended for installation in a motor vehicle is configured in such a way that a large number of electrical control lines and circuits for loads, such as lights, windshield wipers, blinkers, rear window heater, interior heater, mirror heater, solenoids and the like can be centrally combined by means of plug-in connections. The central circuit arrangement 1 includes a housing 2 made of plastic which can be fastened by way of laterally projecting flanges 3 equipped with passage bores 4 to a holding member which is not shown in detail. Plain connectors 6 project from the underside of the bottom 5 of housing 2 and can be connected to wiring harnesses that are provided with plug-in connectors. A collar 7 shaped to bottom 5 surrounds plain connectors 6 which are connected through bottom 5 to a flat printed circuit board 8 resting on the interior of bottom 5 in the form of a pressed screen. A stack composed of a lower insulating plate 9, an electrical distributor plate 10, an upper insulating plate 11 and an upper flat printed circuit board 12 in the form of a pressed screen is disposed on top of flat printed circuit board 8. Altogether they form a plate-like layered conductor packet 13. Above conductor packet 13, a carrier plate 14 equipped With slot recesses 15 is inserted into housing 2, with plug-in sockets 16 being disposed below these recesses on the upper flat printed circuit board 12. On the upper face of carrier plate 14 there are disposed plug-in components, such as electrical flat plug-in fuses 17 and switching devices 18 including a relay. The plug-in portions of these components pass through slot recesses 15 into plug-in sockets 16. A lid 20 fastened to housing 2 be means of snap connections 19 extends over flat plug-in fuses 17 and switching devices 18.

On the upper side of distributor plate 10 which is disposed between the lower insulating plate 9 and the upper insulating plate 11, three mutually parallel, continuous pin strips 21 are disposed along the longitudinal edge of the plate. Their pins 22, which are arranged in a row, pass through respective recesses 23 in insulating plates 9 and II and contact either the associated terminals 24 of the lower flat printed circuit board 8 or of the upper flat printed circuit board 12. On the underside of distributor plate 10, each pin 22 of each pin strip 21 is soldered to a conductor path 25 having at least one terminal 26. Moreover, a plurality of separate conductor path 2 having at least two terminals 28 are disposed on the underside of distributor plate 10. In correspondence with the required circuitry, certain terminals 26, 28 of distributor plate 10 are connected with one another by way of straps 29 which are coated with an insulating lacquer. In order to ensure that the straps 29 cross over one another without contact, straps 29 have correspondingly different heights. If other circuits are now to be connected, it is merely necessary to arrange straps 29 in a correspondingly different manner on distributor plate 10. Thus, the selective attachment of straps 29 provides for the realization of a large number of the most varied circuits.

Each strap 29 includes a base member 30 from whose end branches off a plug-in member 31. Base member 30 of strap 29 may be bent so as to produce certain connection paths in different planes. Each plug-in member 31 of a strap 29 is provided with a pinched section 32 whose underside is spaced from the free end of plug-in member 31 at a distance which is slightly larger than the thickness of distributor plate 10. Thus the insertion depth of straps 29 in terminals 26 and 28 of distributor plate 10 is fixed in a simple manner, thus considerably facilitating their soldering to conductor paths 25, 27 of distributor plate 10.

Figure 10:
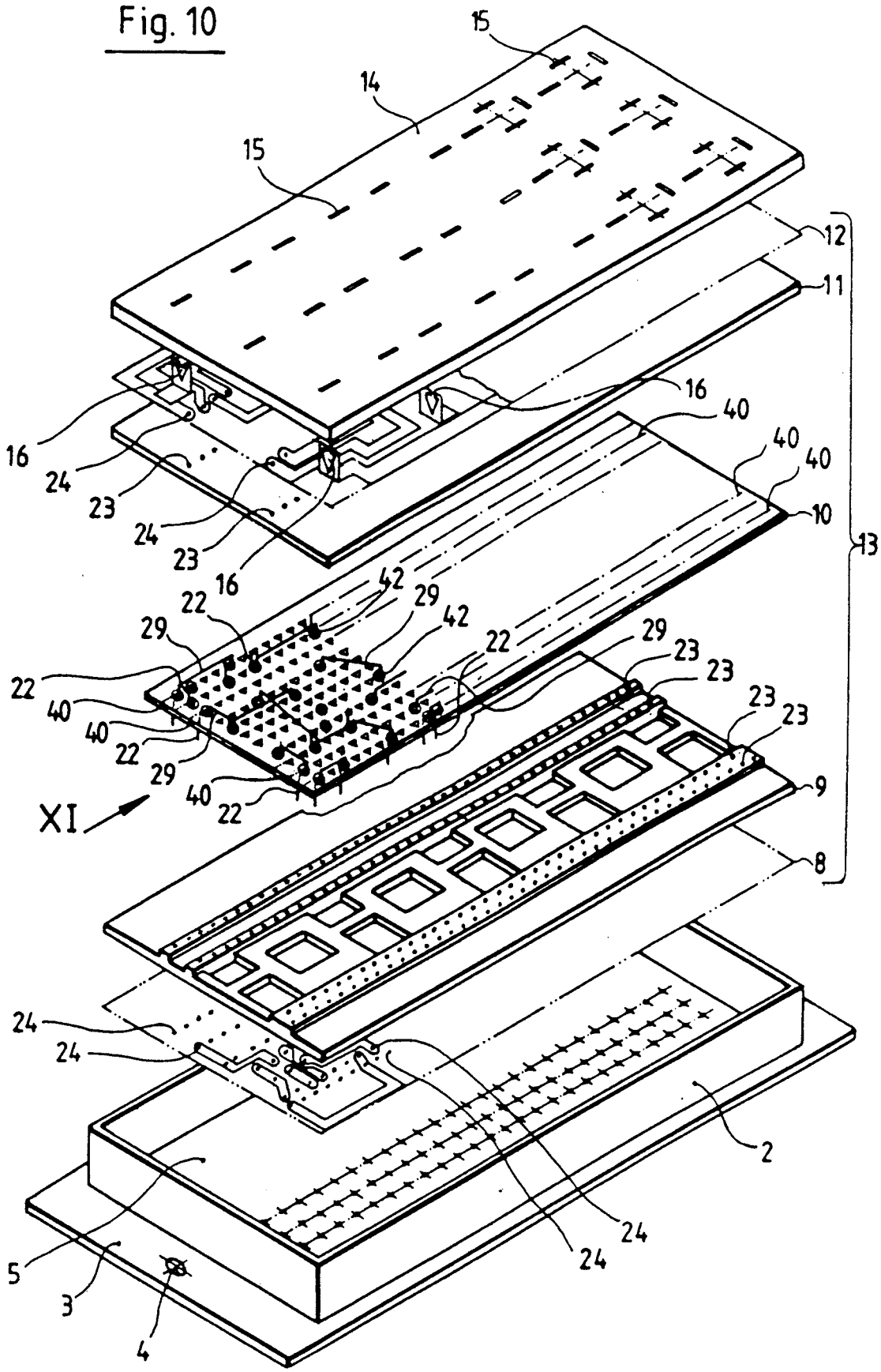
FIG. 10, an alternative embodiment of the central circuit arrangement of FIG. 2.
Figure 11:
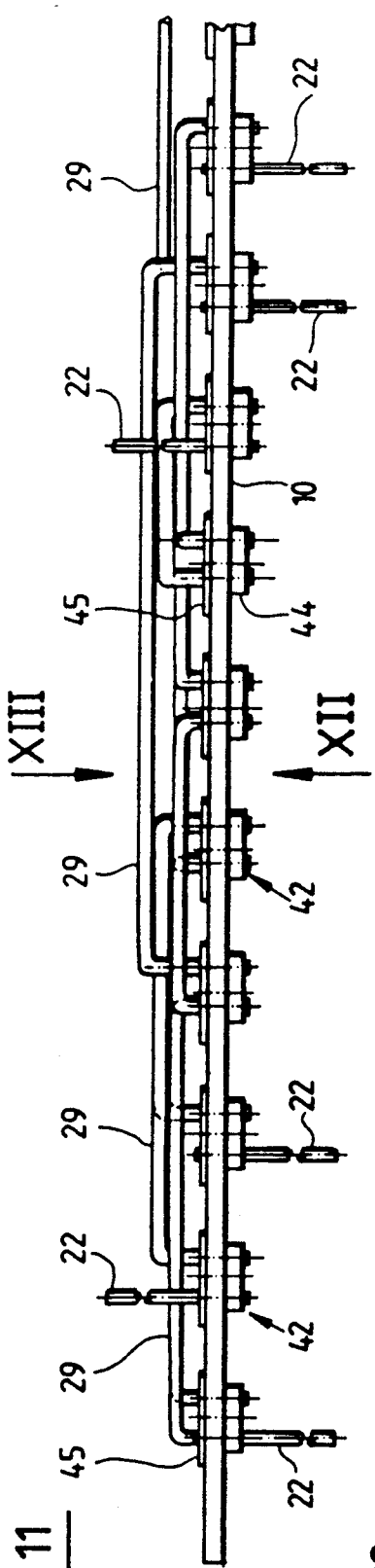
FIG. 11, a view, to an enlarged scale, of the distributor plate of the central circuit arrangement according to FIG. 10 in the direction of arrow XI.
Figure 12:
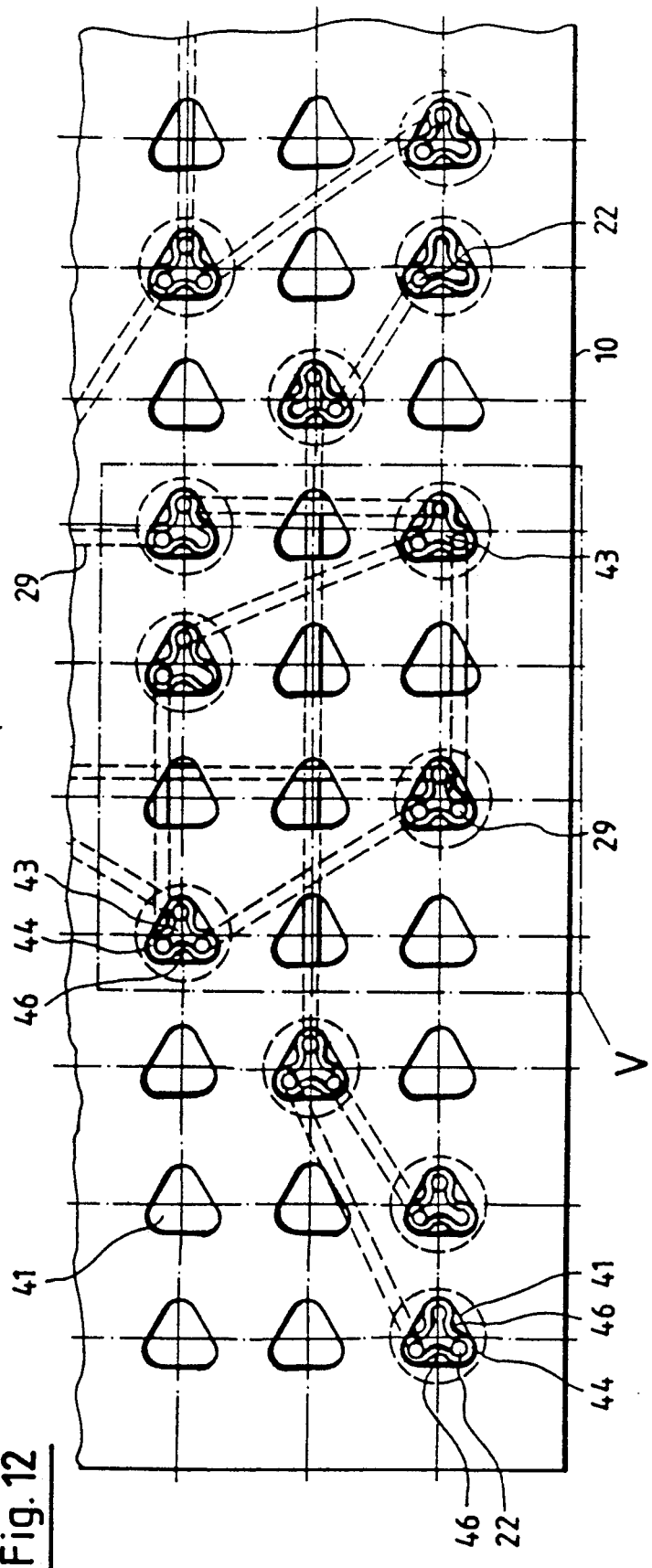
FIG. 12, a partial view of the distributor plate of FIG. 11 in the direction of arrow XII.
Figure 13:
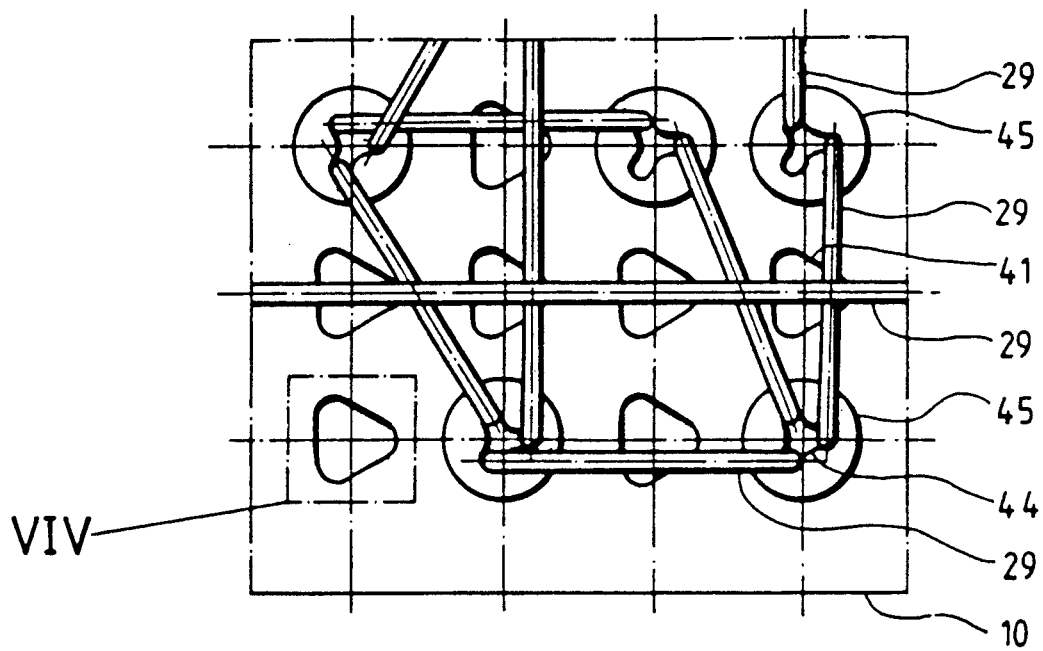
FIG. 13, a partial view of the distributor plate of FIG. 11 in the direction of arrow XIII.
Figure 14:
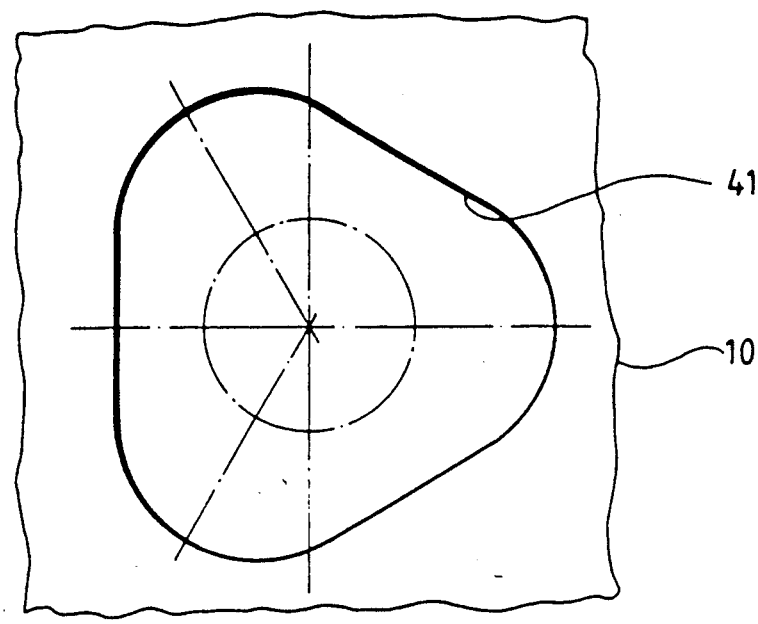
FIG. 14, an enlarged view of the detail "XIV" of FIG. 13.
Figure 15:
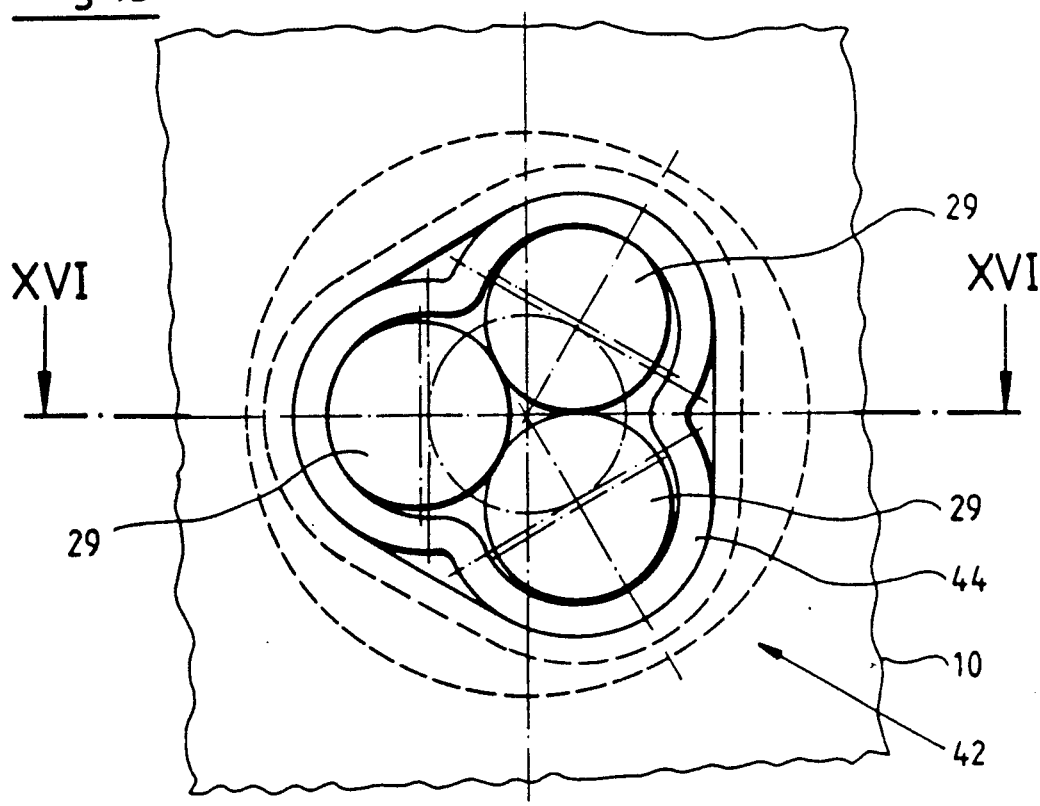
FIG. 15, an alternative embodiment, to an enlarged scale, of a contact socket for a distributor plate according to FIG. 12.
Figure 16:
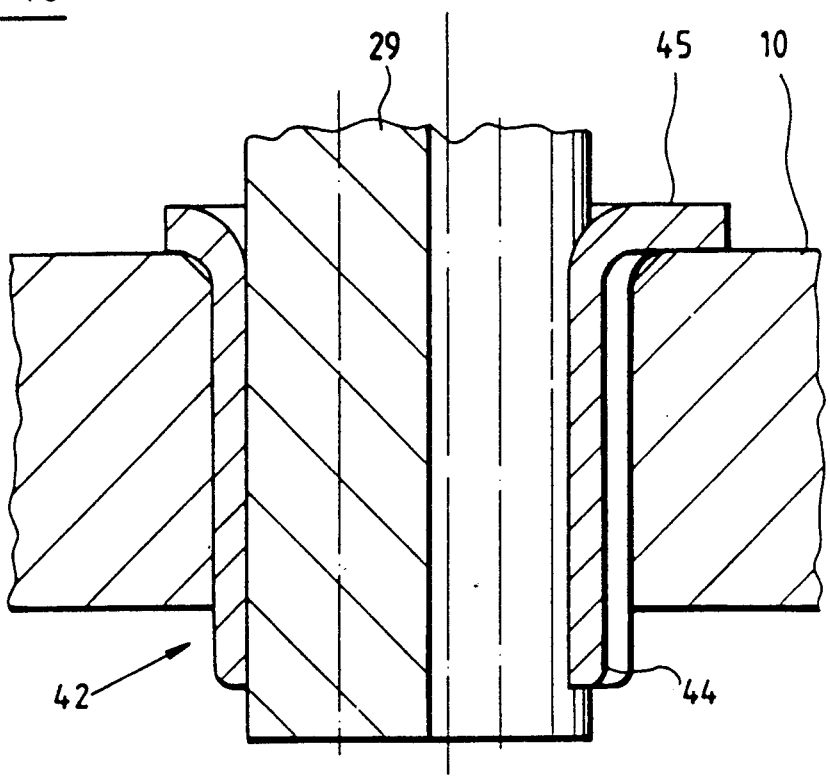
FIG. 16, a sectional view of the illustration of FIG. 15, seen along line XVI—XVI.

In the alternative embodiment of the central circuit arrangement shown in FIG. 10, three mutually parallel, continuous rows of pins 40 are disposed on the upper face of distributor plate 10 along its longitudinal edge. Pins 22 of these rows contact either the associated terminals 24 of the lower flat printed circuit board 8 or of the upper flat printed circuit board 12 through respective recesses 23 in insulating plates 9 and 11. Each pin 22 of each row of pins 40 is inserted into a contact socket 42 disposed in a corresponding perforation 41 in distributor plate 10 and is laser welded to this contact socket, with passage bore 43 of contact socket 42 having at least one further free region for accommodating the free end of a strap 29. Moreover, a plurality of free perforations 41 are made in distributor plate 10 into which can be inserted, if required, contact sockets 42 whose passage bores 43 are able to accommodate at least two free ends of two straps 29. According to the required circuitry, contact sockets 42 of distributor plate 10 are connected with one another by way of straps 29. There straps 29 are laser welded to one another or to the contact socket 42 or one strap 29 is welded to a pin 22 in a row of pins 40, depending on the particular case of use.

The contact sockets 42 of distributor plate 10 depicted in FIGS. 11 to 18 are each composed of a sleeve 44 to which is shaped at one end a continuous external flange 45. Sleeve 44 is inserted in a press fit into the associated perforation 41 of distributor plate 10, with flange 45 resting on the upper face of distributor plate 10. The end of the sleeve facing away from flange 45 projects slightly beyond the underside of distributor plate 10. The straps 29 or the pin 22 of a row of pins 40 received by sleeve 44 extend slightly beyond the end of sleeve 44 facing away from flange 45. This permits favorable laser welding between the parts to be connected. Sleeve 44 of contact socket 42 is provided with continuous constrictions 46 between which the free ends of straps 29, which have a circular cross section, and possibly a pin 22 of a row of pins 40 are disposed. In the contact sockets 42 of FIGS. 11 to 14, sleeve 44 is provided with three mutually 120°. offset constrictions 46, with the dimensions of sleeve 44 being such that, in spite of the insertion of straps 29 or a pin 22 of a row of pins 40 into passage bore 43, the central region of passage bore 43 between constrictions 46 of sleeve 44 remains free, that is, the components inserted into sleeve 44 do not contact one another. Therefore it is necessary to perform laser welding between each inserted component and contact socket 42. In contrast thereto, the contact socket 42 shown in FIGS. 15 and 16, which corresponds in its configuration to contact sockets 42 of FIGS. 11 to 14, has such dimensions that the straps 29 inserted therein contact one another laterally. Thus only two laser welding locations are required between the contacting straps 29.

Figure 17:
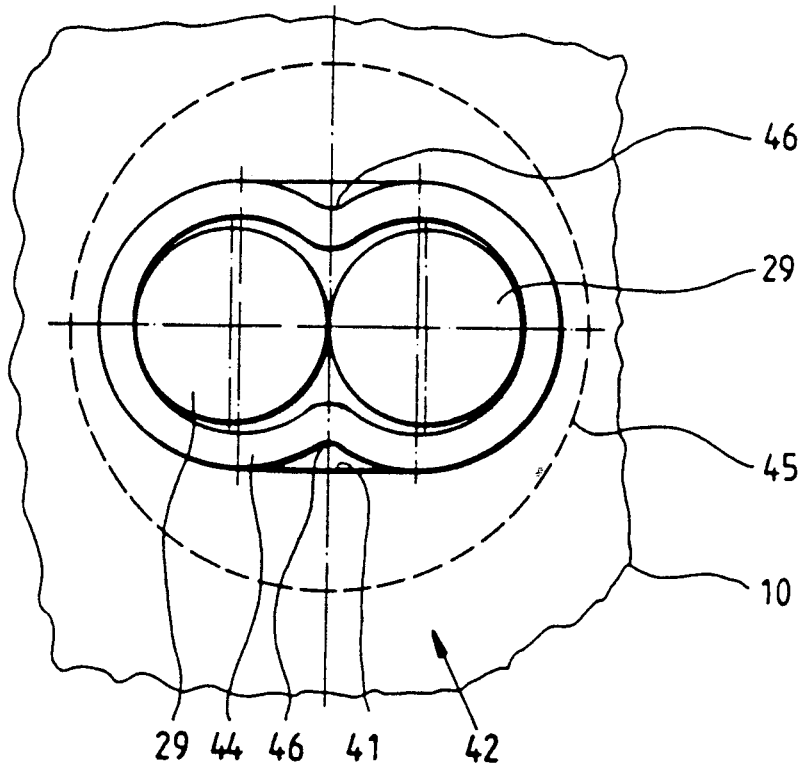
FIG. 17, a further alternative embodiment of a contact socket.
Figure 18:
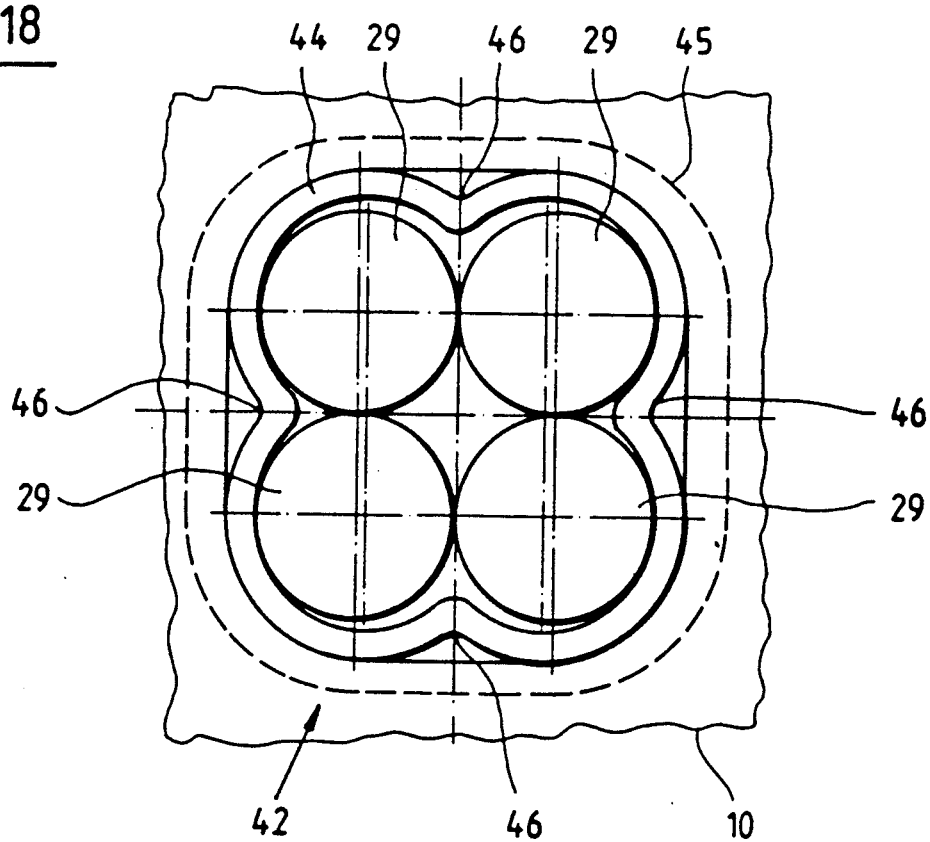
FIG. 18, another alternative embodiment of a contact socket.

The alternative contact socket 42 shown in FIG. 17 accommodates only two straps 29 which laterally contact one another in the region of the facing constrictions 46 of sleeve 44 and are here laser welded together. The alternative contact socket 42 depicted in FIG. 18 is suitable for the accommodation of four straps 29. Sleeve 44 of this contact socket 42 is provided with four constrictions 46 which are arranged at a mutual 90° offset and between which lie the straps 29 in lateral contact with one another. In this case, three laser weld locations are required between straps 29.

Figure 19:
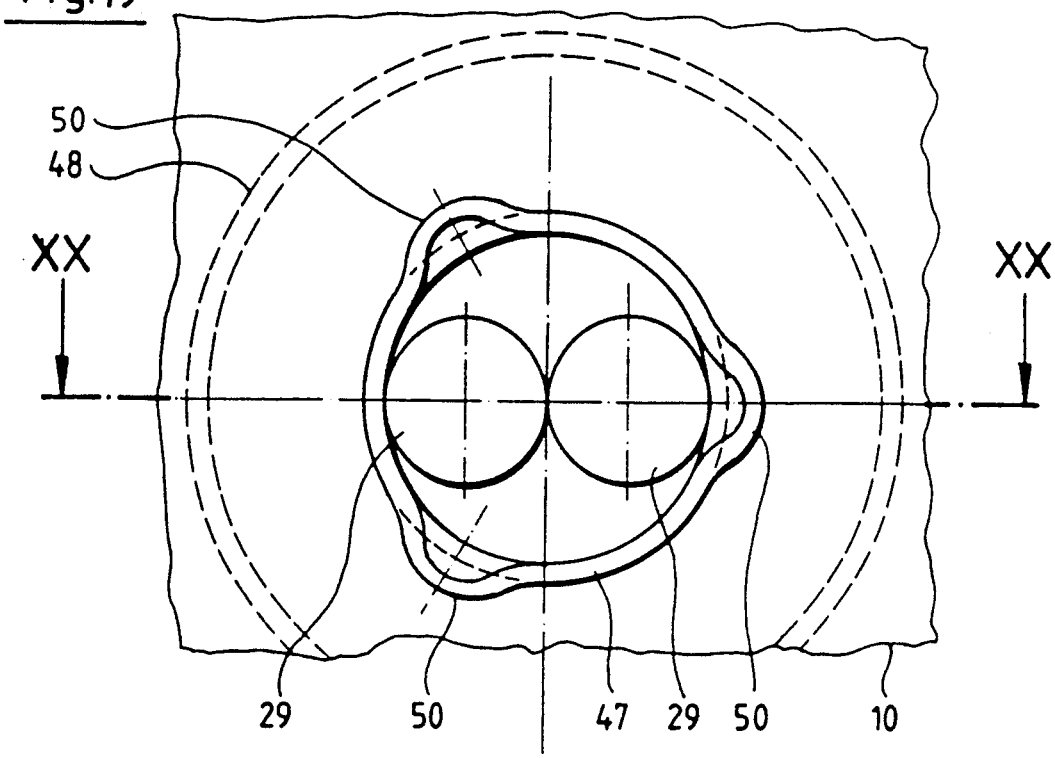
FIG. 19, a further alternative embodiment of the contact socket as a tubular rivet.
Figure 20:
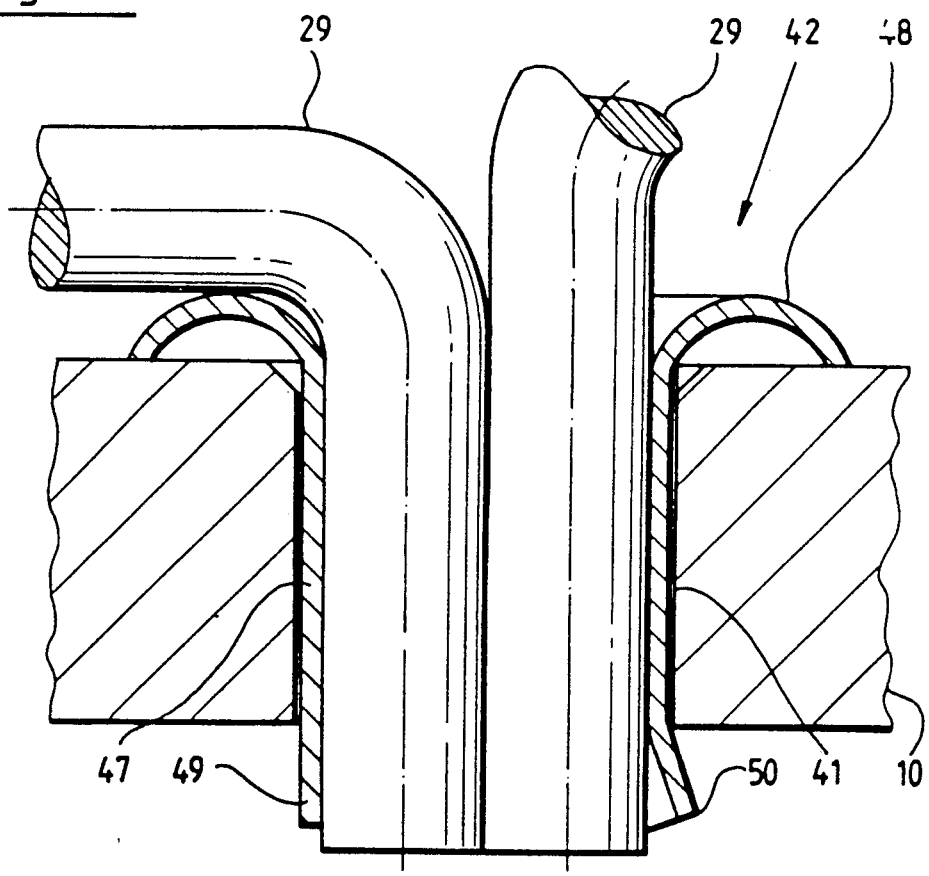
FIG. 20, a sectional view along line XX—XX of the illustration according to FIG. 19.

In the alternative contact socket 42 shown in FIGS. 19 and 20, the latter is configured as a tubular rivet 47. In dependence on the interior diameter of tubular rivet 47, two or more laterally contacting straps 29 can be inserted thereinto. Straps 29 are here laser welded to one another at their respective points of contact. When inserted into an associated perforation 41 of distributor plate 10, the head 48 of tubular rivet 47 is supported o the upper side of distributor plate 10, while its base 49 is caulked into the underside of distributor plate 10 by way of three projections 50 which are spaced at 120°. relative to one another. Thus tubular rivet 47 is given a secure seat in distributor plate 10.

Moreover, after being equipped and laser welded, distributor plate 10 is additionally soldered to provide for further protection for the circuits.

The above drawing description clarifies the details of the particularly simple and easily manipulated construction of the central circuit arrangement which, in spite of its simplicity, has also proven to be extremely variable.

We claim:

1. A central circuit arrangement for motor vehicles for the central connection of electrical components, such as fuses (17), switching devices (18), wiring harnesses, electronic controls for electrical loads and the like and including a plate-like layered conductor packet (13) which is composed of flat printed circuit boards (8, 12) that are arranged on top of one another in different planes and are separated from one another by insulating plates (9, 11), characterized in that an electrical distributor plate (10) with attached pin strips (21) for contacting the flat printed circuit boards (8, 12) adjacent to the insulating plates (9, 11) is disposed between two adjacent insulating plates (9, 11), with each pin (22) of each pin strip (21) having an associated conductor path (25) and a free terminal (26); a plurality of further, separate conductor paths (27) having at least two terminals (28) are provided on the distributor plate (10); and the terminals (26, 28) of the conductor paths (25, 27) can be selectively connected by way of straps (29) which, if required, are configured to have different heights.

2. A central circuit arrangement according to claim 1, characterized in that the terminals (26, 28) of the conductor paths (25, 27) of the distributor plate (10) are selectively connectable with the terminals (24) of the insulated, superposed, flat printed circuit boards (8, 12) by way of straps (29) that laterally project from the conductor packet (13).

3. A central circuit arrangement according to claim 1 characterized in that the straps (29) are coated with an insulating lacquer.

4. A central circuit arrangement according to claim 1 characterized in that each strap (29) includes two plug-in portions (31) which are angled off from a base portion (30) and are provided with a pinched region (32), with the distance of the pinched region (32) from the free end of each plug-in portion (31) being slightly larger than the thickness of the distributor plate (10) or the flat printed circuit boards (8, 12).

5. A central circuit arrangement according to claim 1 characterized in that the base portion (30) of the straps (29) is bent into different planes.

6. A central circuit arrangement according to claim 1 characterized in that the pin strips (21) are replaced by rows of pins (40) and the conductor paths (25, 27) and their free terminals (26, 28) are replaced by contact sockets (42) that are inserted into corresponding perforations (41) in the distributor plate (10), with the passage bore (43) of each contact socket receiving the free ends of a plurality of associated straps (29) or the pin (22) of a row of pins (40) as well as the free end of an associated strap (29) or the free ends of a plurality of associated straps, respectively.

7. A central circuit arrangement according to claim 1 characterized in that each contact socket (42) is composed of a sleeve (44) provided with a continuous flange (45) at its end, with the sleeve being inserted in a press fit into the perforation (41) of the distributor plate (10) and its flange (45) resting on the upper face of the distributor plate (10).

8. A central circuit arrangement according to claim 1 characterized in that the sleeve (44) of the contact socket (42) is provided with constrictions (46) between which are disposed the free ends of the straps (29) and, if required, the pin (22) of a row of pins (40).

9. A central circuit arrangement according to claim 1 characterized in that the sleeve (44) of the contact socket (42) and its constrictions (46) are configured in such a manner that the free ends of the straps (29) inserted thereinto and, if required, the pin (22) of a row of pins (40) laterally contact one another.

10. A central circuit arrangement according to claim 1 characterized in that each contact socket (42) is configured as a tubular rivet (47) which accommodates the inserted ends of the straps (29) and, if required, the pin (22) of a row of pins (40) in mutual lateral contact.

11. A central circuit arrangement according to claim 1 characterized in that the head (48) of the tubular rivet (47) is supported on the upper face of the distributor plate (10) and the base (49) of the tubular rivet (47) is caulked together with the underside of the distributor plate (10) by way of three projections (50) spaced at 120° from one another.

12. A central circuit arrangement according to claim 1 characterized in that components, such as resistors, capacitors, transistors, microprocessors, of the electronic controls for the various electrical loads of the motor vehicle are disposed on the distributor plate (10) separated from the flat plug-in fuses (17) and switching devices (18) disposed on a carrier plate (14) associated with the upper flat printed circuit board (12) of the conductor packet (13) and are connected with terminals of the distributor plate (10) by way of conductor paths.

13. A central circuit arrangement according to claim 1 characterized in that the electronic controls for the various electrical loads of the motor vehicle are centrally combined on the distributor plate (10) in a microcomputer which includes at least one microprocessor in the form of an electronic computer and at least one program memory as well as at least one input/output unit and associated peripherals.

14. A central circuit arrangement according to claim 1 characterized in that plain connectors (6) extending through the bottom (5) of a housing (2) accommodating the conductor packet (13) and the carrier plate (14) and being delimited by a collar (7) formed at the housing bottom (5) are disposed at the lower flat printed circuit board (8) of the conductor packet (13) for the connection of wiring harnesses.

15. A central circuit arrangement according to claim 1 characterized in that the housing (2) is closed by means of a lid (20) which extends over the flat plug-in fuses (17) and the switching devices (18) on the carrier plate (14).

16. A method of producing and installing the straps for a central circuit arrangement according to claim 1 characterized in that, in dependence on the intended placement of the straps (29) on the distributor plate (10), the length and height of the straps are initially determined by means of a computer controlled automatic apparatus, then the straps are bent accordingly and thereafter they are installed on the distributor plate (10) and laser welded and/or soldered.

* * * * *